Sept. 9, 1958 G. C. SZIKLAI ET AL 2,851,615

SEMICONDUCTOR DEVICES AND SYSTEMS

Filed June 22, 1953

INVENTORS
GEORGE C. SZIKLAI &
GERALD B. HERZOG

BY [signature]
ATTORNEY

United States Patent Office 2,851,615

Patented Sept. 9, 1958

2,851,615

SEMICONDUCTOR DEVICES AND SYSTEMS

George C. Sziklai and Gerald B. Herzog, Princeton, N. J., assignors to Radio Corporation of America, a corporation of Delaware Application June 22, 1953, Serial No. 363,332

21 Claims. (Cl. 307—88.5)

This invention relates to semiconductor devices and particularly to multi-electrode semiconductor devices and systems in which they may be employed.

One type of semiconductor device is known as a transistor and comprises a body of semiconductor material of one type of conductivity having at least two rectifying electrodes in operative relation therewith. The rectifying electrodes may comprise point contact electrodes or P-N junction electrodes. P-N junctions comprise zones of N-type and P-type conductivity material separated by rectifying barriers which have high resistance to electrical current flow in one direction and low resistance to such flow in the reverse direction.

In these devices, one of the rectifying electrodes is operated as an emitter electrode and injects minority charge carriers into the semiconductor body, said carriers being collected by the other rectifying electrode which is operated as a collector electrode. A base electrode is generally connected in ohmic contact with the semiconductor body and serves to control the emitter-to-collector current flow.

Ordinarily, in transistors, the flow of electrical charge carriers from the emitter to collector occurs by a process of diffusion as a result of which the charge transit time is comparatively high and there is substantially no control of the process. Furthermore, the typical transistor, although satisfactory for operation as an amplifier, oscillator or the like is not readily suitable for performing more complex functions such as multipole switching, complex inter-modulating or the like.

Accordingly, an important object of this invention is to provide a semiconductor device of new and improved form.

A further object is to provide an improved multi-electrode semiconductor device.

Another object is to provide an improved semiconductor device having a plurality of electrodes and capable of performing complex electrical functions.

Still another object is to provide a semiconductor device adapted to perform complex electrical functions and having improved means for controlling charge carrier transit within the body of the device.

A further object of the invention is to provide a novel modulation or demodulation system including a semiconductor device.

In general, the purposes and objects of this invention are accomplished by the provision of a semiconductor body having a single emitter electrode and a plurality of collector electrodes disposed about the emitter and in operative relation therewith. Means are provided for connection to a polyphase source of alternating current or field signal for establishing a rotating electric field in the body, said field being employed to control the flow of minority charge carriers from the emitter to the various collectors. Alternatively, the electrodes may be operated as a single collector and a plurality of emitters.

The invention is described in greater detail by reference to the drawings wherein.

Like elements are designated by similar reference characters throughout the drawing.

Figure 1:
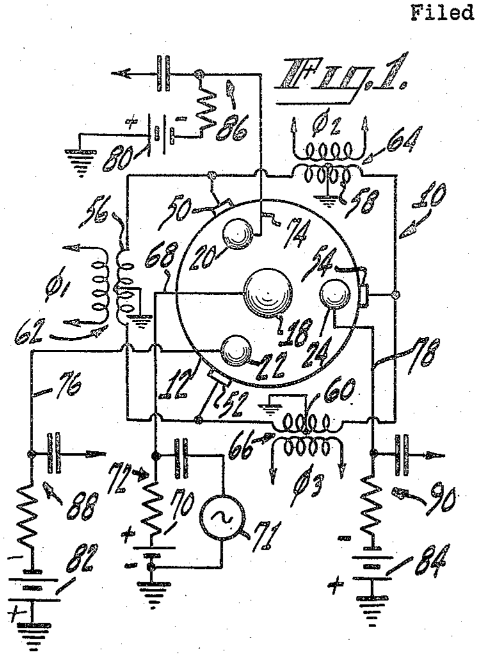
Fig. 1 is a plan view of a transistor device and a schematic representation of a circuit in which it may be operated according to one embodiment of the invention.

Referring to Figure 1, a device 10 embodying the principles of the invention comprises a body 12 of semiconductor material, for example germanium or silicon of N-type or P-type conductivity. The semiconductor body or crystal will henceforth be described as N-type germanium and may be in the form of a circular disk or rectangular plate and in this embodiment is preferably in the form of a disk having two plane parallel surfaces. The device 10 is provided with a plurality of rectifying electrodes of the small area variety such as point contacts or of the P-N junction type. The following description will be limited to P-N junction rectifying electrodes. In the device 10, four such electrodes are provided which are intended for operation as emitter or collector electrodes. According to the invention and referring to Figure 1, the P-N junction electrodes are arranged with one electrode 18 substantially at the center of one surface of the crystal 12 and the remaining three electrodes 20, 22, 24 spaced radially equidistant from the electrode 18 and approximately 120° apart. In an alternative construction shown in Figure 2, the central electrode 18' may be positioned in the opposite surface of the crystal.

The P-N junction electrodes may be formed in any suitable manner, for example by bombarding the crystal 12 with charged particles according to the teaching of K. Lark-Horovitz in U. S. Patent 2,588,254. Alternatively, the P-N junctions may be formed by an alloying process according to the teaching of Charles W. Mueller in a co-pending U. S. patent application, Serial Number 295,304, filed June 24, 1952 and assigned to the assignee of this application or as also described in a paper by Law et al. entitled "A Developmental Germanium P-N-P Junction Transistor," in the November 1952 Proceedings of the IRE. According to the method described in said application and paper and to form a P-N-P transistor, disks or pellets of a so-called impurity material, for example indium, are placed in contact with a surface or surfaces of the block 12 of N-type germanium. The assembly of block and pellets is heated in an atmosphere of hydrogen, or an inert gas such as argon. The heating is effected at a temperature sufficient to cause the pellets of impurity material to melt and alloy with the germanium block to form the P-N junctions. These P-N junction electrodes formed by the alloying process include rectifying barriers, thin layers of P-type material and regions which comprise alloys of indium and germanium and which do not have semiconductor properties. These details are fully described in the co-pending Mueller application and are not shown here.

With a body of N-type germanium, the impurity material may comprise one or more acceptor substances such as indium, aluminum, gallium, boron or zinc. If the semiconductor body is of P-type germanium, the impurity material may comprise one or more donor substances such as arsenic, bismuth, antimony, sulfur, selenium, tellurium or phosphorus. In this embodiment of the invention three base electrodes 50, 52, 54 are bonded to the periphery of the semiconductor crystal in low resistance or ohmic contact. These base electrodes are spaced around the periphery of the germanium disk with each in radial alignment with one of the spaced P-N junction electrodes 20, 22, 24. This radial alignment of the base electrodes and the latter junction electrodes is not essential.

Figure 2:
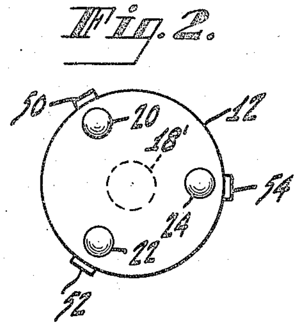
Fig. 2 is a plan view of a modification of the device of Fig. 1.

In operation of the devices shown in Figures 1 and 2, a three phase input signal is applied between the base electrodes 50, 52, 54 to provide a rotating field within the germanium body 12. To this end, the secondary windings 56, 58, 60 of transformers 62, 64, 66 are connected between base electrodes 50 and 52, 50 and 54, and 52 and 54 respectively. The primary windings of the transformers are energized with conventional three phase alternating current signals $\phi 1$, $\phi 2$ and $\phi 3$.

According to the invention, in operation of the device 10, one P-N junction electrode, e. g. 18, is intended for operation as an emitter electrode and the electrodes 20, 22, 24 are intended for operation as collectors. To this end, the electrode 18 is biased in the forward direction with respect to the germanium crystal by a connection 68 to the positive terminal of a battery 70, the negative terminal of which is connected to ground. An input signal source 71 is connected to the emitter electrode 18 for example through a resistance-capacitance network 72. The collector electrodes 20, 22, 24 are biased in the reverse direction with respect to the germanium disk by connections 74, 76, 78 respectively to the negative terminals of batteries 80, 82, 84, respectively, the positive terminals of which are connected to ground. Suitable output circuits indicated by arrows are connected to the collector electrodes 20, 22, 24, for example, by means of resistance-capacitance network, 86, 88, 90 respectively.

Figure 3:
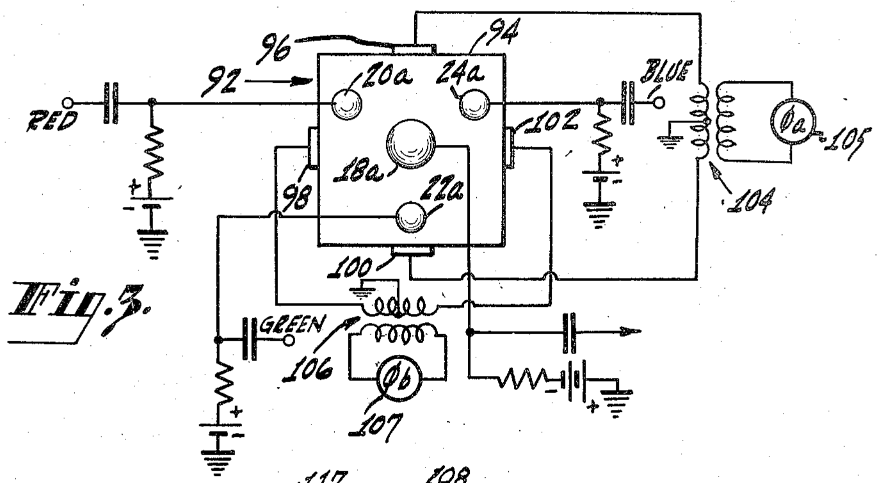
Fig. 3 is a plan view of a transistor device and a schematic representation of a circuit in which it may be operated according to another modification of the invention; and, Fig. 4 is a plan view of a transistor device and a schematic representation of associated circuitry according to still another embodiment of the invention.

According to the invention, a current of minority charge carriers is injected into the germanium body 12 by the emitter electrode 18 under the control of the signal from the source 71. Under the control of the rotating electric field established by the three phase signals $\phi 1$, $\phi 2$ and $\phi 3$ between the base electrodes 50, 52, 54, the current from the emitter is transmitted to each of the collector electrodes 20, 22, 24 in turn. The flow of minority charge carriers to each collector provides an output current appearing in the load circuit of each collector. The device 10 is thus employed as a signal demodulator whereby a single composite signal may be converted into a plurality of separate signals. The P-N junction electrodes of the device 10 may be reversed in operation and the electrode 18 may be employed as a single collector and the electrodes 20, 22, 24 may be employed as emitters. Such a device may be employed as a signal modulator or time multiplex device whereby a plurality of discrete signals applied to each emitter may be converted into a composite signal emanating from the single collector (Fig. 3). The two foregoing embodiments may be operated jointly, for example one in a signal receiver and one in a signal transmitter. In such an arrangement, the rotating electric field has the same frequency in each device.

Referring now to Figure 3, in an alternative embodiment of the invention, a device 92 includes an N-type germanium crystal 94 having a rectangular cross-section. Four P–N junction electrodes 18*a*, 20*a*, 22*a*, 24*a* constituting a collector and three emitter electrodes, respectively, similar to the electrodes described with respect to Figures 1 and 2 are formed in the germanium crystal in substantially the same arrangement. In this embodiment of the invention base electrodes 96, 98, 100, 102 are soldered one to each edge of the crystal and in ohmic contact therewith. The electrodes 18*a*, 20*a*, 22*a*, 24*a* are biased and otherwise connected to appropriate circuitry as described below. However, according to the invention, in this embodiment the rotating electric field is achieved by applying two sinusoidal signals, 90° out of phase, to each pair of diametrically positioned base electrodes. Such an arrangement is more convenient for operation at higher rotating field frequencies than the circuit of Figure 1. To this end, base electrodes 96 and 100 are connected through the secondary winding of a transformer 104 the primary winding of which is energized by a sinusoidal signal $\phi a$ from a source 105. The base electrodes 98 and 102 are similarly connected through the secondary winding of a transformer 106, the primary winding of which is energized by a sinusoidal signal $\phi b$ from a source 107. The signals $\phi a$ and $\phi b$ from the sources 105 and 107 are 90° out of phase.

The device 92 may be conveniently employed as a color signal modulator in a color television transmitter wherein, for example, three discrete signals are generated which are representative of the red, green and blue components of a scene to be televised. In such a transmitter, the three separate color signals differ in phase and may be modulated to form a composite signal which may be further modified and then transmitted. In such a system, the P-N junction electrode 18*a* is biased in the reverse direction, as shown, and is operated as a single collector and the electrodes 20*a*, 22*a*, 24*a* are biased in the forward direction, as shown, and are operated as emitter electrodes. A red signal may, for example be applied to the emitter 20*a*, a green signal to the emitter 22*a* and a blue signal to the emitter 24*a*. The electric field is rotated at the proper color sampling frequency and the output from the collector electrode 18*a* is a composite signal including red, green, and blue components. A device similar to the device 92 but having a single emitter and three collectors, in the manner shown in Fig. 1, may be employed in a corresponding color receiver to demodulate the composite color signal to recover the individual red, green and blue components which may be modified as required before they are applied to a kinescope.

In certain applications, the electrodes 20, 22, 24 (Fig. 1) or 20*a*, 22*a*, 24*a* (Fig. 3) may be asymmetrically arranged with respect to each other and/or with respect to the central electrode 18 or 18*a* to allow asymmetrical distribution of the signal or, for example, to allow the signal from a single emitter to be shared by two collectors. Such asymmetrical sampling may be employed, for example, in color television applications to improve signal-to-noise ratio in certain color channels.

Figure 4:
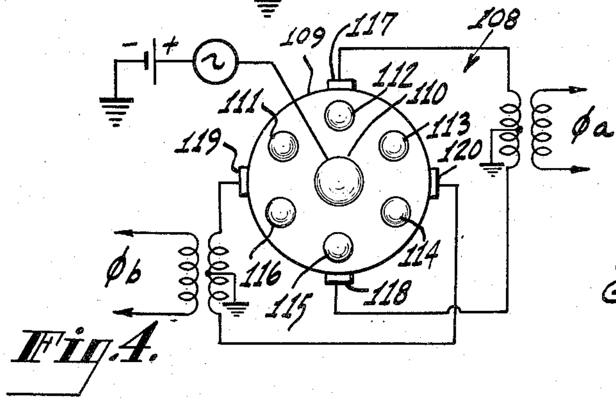

The principles of the invention are not limited to a device having only four P–N junction electrodes arranged either as a single collector and three emitters or vice versa. Another embodiment of the invention, accordingly is shown in Figure 4 and comprises a device 108 including a semiconductor crystal 109, e. g. a disk of N-type germanium, having a single central P–N junction electrode 110 and six other P–N junction electrodes 111, 112, 113, 114, 115, 116 spaced radially equidistant from the central junction 110 and circumferentially equidistant from each other. Means are provided for establishing a rotating electric field in the germanium crystal. Such means may be similar to that shown in Figure 3 and includes diametrically opposed base electrodes 117 and 118 having a first sinusoidal signal applied therebetween. Another pair of diametrically opposed base electrodes 119 and 120 has a similar signal applied between them which is 90° out of phase with the first signal.

As described above, the device 108 may be used as a modulator or demodulator by employing the central electrode 110 as a single collector and the other six electrodes 111, 112, 113, 114, 115, 116 as emitters or vice versa.

What is claimed is:

1. A semiconductor device comprising a body of semiconductor material, a plurality of rectifying electrodes mounted in operative relation with said body, and means connected to said body for establishing a rotating electric field therein whereby the flow of current between said electrodes is controlled.

2. A semiconductor device comprising a body of semiconductor material, a plurality of P–N junction rectifying electrodes mounted in operative relation with said body, and means connected to said body for establishing a rotating electric field therein whereby the flow of current between said electrodes is controlled.

3. The device described in claim 2 wherein said means comprises three base electrodes having a three phase alternating signal applied thereto.

4. The device described in claim 2 and wherein said means comprises two pairs of diametrically opposed base electrodes, each pair having a sinusoidal signal applied thereto, one signal being 90° out of phase with the other.

5. A semiconductor device comprising a body of semiconductor material, a first rectifying electrode mounted in operative relation with said body, a plurality of other rectifying electrodes in contact with said body and disposed about said first electrode, and means connected to said body for establishing a rotating electric field therein whereby the flow of current between said electrodes is controlled.

6. The device set forth in claim 5 wherein said other electrodes are symmetrically disposed about said first electrode radially equidistant therefrom and angularly equally spaced from each other.

7. The device set forth in claim 6 wherein said first and said other electrodes include P–N junctions.

8. The device set forth in claim 7 wherein said first electrode is an emitter electrode and said other electrodes are collector electrodes.

9. The device set forth in claim 7 wherein said first electrode is a collector electrode and said other electrodes are emitter electrodes.

10. A semiconductor system including a body of semiconductor material, an emitter electrode mounted in operative relation with one surface of said body at substantially the center thereof, said emitter electrode being biased in the forward direction with respect to said body, signal input means connected to said emitter electrode, a plurality of collector electrodes disposed about said emitter electrode, said collector electrodes being biased in the reverse direction with respect to said body, means connected to each of said collector electrodes for deriving an output signal therefrom, and means connected to said body for establishing a rotating electric field therein whereby the flow of current between said electrodes is controlled.

11. The system set forth in claim 10 wherein said means comprises three base electrodes having a three phase alternating signal applied thereto.

12. The system set forth in claim 10 wherein said means comprises two pairs of diametrically opposed base electrodes, each pair having a sinusoidal signal applied thereto, one signal being 90° out of phase with the other.

13. A semiconductor system including a body of semiconductor material, a collector electrode mounted in operative relation with one surface of said body at substantially the center thereof, said collector electrode being biased in the reverse direction with respect to said body, means connected to said collector electrode for deriving an output signal therefrom, a plurality of emitter electrodes disposed about said collector electrode, said emitter electrodes being biased in the forward direction with respect to said body, separate signal input means connected to each of said emitter electrodes, and means connected to said body for establishing a rotating electric field therein whereby the flow of current between said electrodes is controlled.

14. The system set forth in claim 10 wherein said means comprises three base electrodes having a three phase alternating signal applied thereto.

15. The system set forth in claim 10 wherein said means comprises two pairs of diametrically opposed base electrodes, each pair having a sinusoidal signal applied thereto, one signal being 90° out of phase with the other.

16. A semiconductor device comprising a body of semiconductor material, a plurality of rectifying electrodes mounted in operable relation with said body, and means operatively associated with said body for establishing a rotating field therein whereby flow of current between said electrodes is controlled.

17. Semiconductor apparatus comprising a body of semiconductor material having a first rectifying electrode and a plurality of other rectifying electrodes spaced apart from and surrounding said first electrode and connection means in ohmic contact with said body for establishing a rotating field in said body in response to polyphase field signals applied thereto.

18. Semiconductor apparatus comprising a body of semiconductor material having a first rectifying electrode and a plurality of other rectifying electrodes spaced apart from and surrounding said first electrode and a plurality of base electrodes in ohmic contact with said body and means for applying polyphase field signals to said base electrodes for establishing a rotating field in said body for controlling current flow between said first and said other rectifying electrodes.

19. In color television apparatus, a semiconductor device including a body of semiconductor material, a rectifying electrode means mounted in operative relation with said body and biased in one direction with respect to said body, another rectifying electrode means disposed about said first named electrode means and biased in the opposite direction with respect to said body, separate sources of signal components representative of different color aspects of a subject image coupled to one of said electrode means, means in operative relation with said body for establishing a rotating field therein whereby the flow of current between said one and said other means is controlled, and means coupled to the other of said electrode means for deriving an output signal therefrom comprising a composite of a plurality of said signal components.

20. In color television apparatus, a semiconductor device including a body of semiconductor material, an emitter electrode mounted in operative relation with one surface of said body, said emitter electrode being biased in the forward direction with respect to said body, signal input means coupled to said emitter and including a source of a composite color television signal including color representative components, a plurality of collector electrodes disposed about said emitter electrode, said collector electrodes being biased in the reverse direction with respect to said body, means connected to each of said collector electrodes for deriving an output signal therefrom representative of respectively different ones of said color representative components, and means in operative relation with said body for establishing a rotating field therein whereby the flow of current between said emitter electrode and each of said collector electrodes is controlled.

21. In color television apparatus, a semiconductor device including a body of semiconductor material, a collector electrode mounted in operative relation with one surface of said body, said collector electrode being biased in the reverse direction with respect to said body, a plurality of emitter electrodes disposed about said collector electrode, said emitter electrodes being biased in the forward direction with respect to said body, separate sources of color signals respectively representative of different color aspects of a subject image coupled to each of said emitter electrodes, means in operative relation with said body for establishing a rotating field therein whereby the flow of current between said emitter electrodes and said collector electrode is controlled, and means coupled to said collector electrode for deriving an output signal therefrom comprising a composite of a plurality of components representative of said signals.

References Cited in the file of this patent

UNITED STATES PATENTS

| | | |
|---|---|---|
| 1,222,440 | Meyer | Apr. 10, 1917 |
| 1,919,053 | Brinton | July 18, 1933 |
| 2,553,490 | Wallace | May 15, 1951 |
| 2,666,150 | Blakely | Jan. 12, 1954 |
| 2,702,838 | Haynes | Feb. 22, 1955 |
| 2,790,037 | Shockley | Apr. 23, 1957 |